(12) United States Patent
Matsuoka et al.

(10) Patent No.: US 11,031,269 B2
(45) Date of Patent: Jun. 8, 2021

(54) SUBSTRATE TRANSPORT ROBOT, SUBSTRATE TRANSPORT SYSTEM, AND SUBSTRATE TRANSPORT METHOD

(71) Applicants: KAWASAKI JUKOGYO KABUSHIKI KAISHA, Kobe (JP); KAWASAKI ROBOTICS (USA), INC., Wixom, MI (US)

(72) Inventors: Junichi Matsuoka, Kobe (JP); Iori Kurata, San Jose, CA (US); Tomokazu Arita, San Jose, CA (US)

(73) Assignees: KAWASAKI JUKOGYO KABUSHIKI KAISHA, Kobe (JP); KAWASAKI ROBOTICS (USA), INC., Wixom, MI (US)

( * ) Notice: Subject to any disclaimer, the term of this patent is extended or adjusted under 35 U.S.C. 154(b) by 69 days.

(21) Appl. No.: 16/548,041

(22) Filed: Aug. 22, 2019

(65) Prior Publication Data
US 2021/0057251 A1    Feb. 25, 2021

(51) Int. Cl.
*H01L 21/67* (2006.01)
*H01L 21/677* (2006.01)

(52) U.S. Cl.
CPC .. *H01L 21/67742* (2013.01); *H01L 21/67161* (2013.01); *H01L 21/67748* (2013.01)

(58) Field of Classification Search
None
See application file for complete search history.

(56) References Cited

U.S. PATENT DOCUMENTS

| | | | | |
|---|---|---|---|---|
| 5,789,890 A * | 8/1998 | Genov | | B25J 9/1615 318/567 |
| 6,737,826 B2 * | 5/2004 | Gilchrist | | B25J 9/042 318/567 |
| 6,934,606 B1 * | 8/2005 | Genetti | | H01L 21/67201 118/712 |
| 6,960,057 B1 * | 11/2005 | Hofmeister | | B25J 9/106 414/744.5 |
| 8,297,907 B2 * | 10/2012 | Yazawa | | B25J 15/028 414/744.5 |

(Continued)

FOREIGN PATENT DOCUMENTS

JP    2000-133690 A    5/2000
JP    2008-135630 A    6/2008

(Continued)

*Primary Examiner* — Ronald P Jarrett
(74) *Attorney, Agent, or Firm* — Oliff PLC

(57) ABSTRACT

A substrate transport robot includes: a base installed inside a transport chamber; an arm; a first hand and a second hand rotatable about a vertical hand axis and configured to support a substrate; and a controller. The controller performs: a first transfer process of causing the first hand to enter from the transport chamber into a storage chamber, and transferring the substrate between the first hand and a placing portion in the storage chamber; an exit process of causing the first hand to exit the storage chamber into the transport chamber; and a second transfer process of causing the second hand to enter from the transport chamber into the storage chamber. In the exit process, the hand axis moves away from a center line of an opening, such that the hand axis is farther from the center line than a reference position of the first hand is.

9 Claims, 7 Drawing Sheets

(56) References Cited

U.S. PATENT DOCUMENTS

| | | | |
|---|---|---|---|
| 8,562,271 B2* | 10/2013 | Hofmeister | H01L 21/67742 414/217 |
| 9,002,514 B2* | 4/2015 | Genetti | H01L 21/67196 700/248 |
| 9,076,830 B2* | 7/2015 | Kremerman | B25J 9/044 |
| 10,424,498 B2* | 9/2019 | Hofmeister | H01L 21/67742 |
| 10,748,796 B2* | 8/2020 | Shindo | H01L 21/6719 |
| 10,811,293 B2* | 10/2020 | Hashimoto | H01L 21/67742 |
| 2017/0069517 A1 | 3/2017 | Goto et al. | |

FOREIGN PATENT DOCUMENTS

| | | |
|---|---|---|
| JP | 2011-228627 A | 11/2011 |
| JP | 2017-074644 A | 4/2017 |
| WO | 2017/037976 A1 | 3/2017 |

* cited by examiner

SUBSTRATE TRANSPORT ROBOT, SUBSTRATE TRANSPORT SYSTEM, AND SUBSTRATE TRANSPORT METHOD

BACKGROUND OF THE INVENTION

1. Field of the Invention

The present invention relates to a substrate transport robot for transporting a substrate inside a transport chamber, and transferring the substrate between a hand and a substrate placing portion in a storage chamber that communicates with the transport chamber via an opening. The present invention particularly relates to a substrate transport robot including a first hand and a second hand, each of which is configured to support a substrate. The present invention relates to a substrate transport system including the substrate transport robot and a method of transporting a substrate by the substrate transport robot.

2. Description of the Related Art

JP 2011 228627 A discloses a substrate transport robot for transporting a substrate, such as a semiconductor wafer, inside a transport chamber. The substrate transport robot includes: a horizontal articulated arm; and one or two hands, each of which is configured to support a substrate. When one hand is caused to exit a storage chamber into the transport chamber, the one hand and its rotational center move straight in a direction perpendicular to an opening of the storage chamber. After the one hand has exited the storage chamber, in order to move the one hand inside the transport chamber and cause the other hand to enter the storage chamber, it is necessary to rotate the one or two hands. After the one hand has exited the storage chamber and before the hand(s) is/are rotated, if the arm is caused to make complex motions for the purpose of preventing the rotating hand(s) from interfering with walls that demarcate the transport chamber, the throughput of the substrate transport robot decreases.

SUMMARY OF THE INVENTION

An object of the present invention is to improve the throughput of a substrate transport robot.

A substrate transport robot according to the present invention includes: a base installed inside a transport chamber; an arm coupled to the base and including a plurality of links, each of which is configured to rotate within a horizontal plane; a first hand and a second hand, each of which is coupled to a distal end portion of the arm such that each of the first hand and the second hand is rotatable about a vertical hand axis, the first hand and the second hand each being configured to support a substrate; and a controller. The controller is configured to perform: a first transfer process of causing the first hand to enter from the transport chamber into a storage chamber that communicates with the transport chamber via an opening, and transferring the substrate between the first hand and a placing portion in the storage chamber, the placing portion being a portion on which the substrate is to be placed; an exit process of causing the first hand to exit the storage chamber into the transport chamber; and a second transfer process of causing the second hand to enter from the transport chamber into the storage chamber, and transferring the substrate between the placing portion and the second hand. In the exit process, the controller is configured to control operations of the arm and the first hand in a manner to move the hand axis away from a center line of the opening, the center line being perpendicular to the opening, such that the hand axis is farther from the center line than a reference position of the first hand is.

According to the above configuration, while the first hand is exiting the storage chamber, the hand is kept close to the center line of the opening. This makes it possible to prevent the hand from interfering with the inner surfaces of the storage chamber or the edge of the opening. On the other hand, the hand axis moves away from the center line of the opening, such that the hand axis is significantly far from one of the walls demarcating the transport chamber, the one wall extending in the direction in which the center line extends. Accordingly, after the first hand has exited the storage chamber, the first hand and the second hand can rotate about the hand axis without interfering with the one wall. Consequently, an operation of the arm to be performed after the first hand has exited the storage chamber can be eliminated or simplified, and a transition from the exit process to the second transfer process can be made promptly. Therefore, the throughput of the substrate transport robot is improved.

A substrate transport system according to the present invention includes: a transport chamber in which a substrate is transported; a storage chamber forming part forming a storage chamber that communicates with the transport chamber via an opening, the storage chamber including therein a placing portion on which the substrate is to be placed; and the above-described substrate transport robot.

A substrate transport method according to the present invention is a method of transporting a substrate by a substrate transport robot. The substrate transport robot includes: a base installed inside a transport chamber; an arm coupled to the base and including a plurality of links, each of which is configured to rotate within a horizontal plane; and a first hand and a second hand, each of which is coupled to a distal end portion of the arm such that each of the first hand and the second hand is rotatable about a vertical hand axis, the first hand and the second hand each being configured to support a substrate. The method includes: a first transfer step of causing the first hand to enter from the transport chamber into a storage chamber that communicates with the transport chamber via an opening, and transferring the substrate between the first hand and a placing portion in the storage chamber, the placing portion being a portion on which the substrate is to be placed; an exit step of causing the first hand to exit the storage chamber into the transport chamber in a manner to move the hand axis away from a center line of the opening, the center line being perpendicular to the opening, such that the hand axis is farther from the center line than a reference position of the first hand is; and a second transfer step of causing the second hand to enter from the transport chamber into the storage chamber, and transferring the substrate between the placing portion and the second hand.

DETAILED DESCRIPTION OF THE PREFERRED EMBODIMENTS

Hereinafter, one embodiment is described with reference to the drawings. For the sake of convenience of the description, the vertical direction in FIG. 1 may be referred to as a "forward-rearward direction X" as one example of a horizontal "first direction". Also, the right-left direction in FIG. 1 may be referred to as a "right-left direction Y" as one example of a horizontal "second direction" perpendicular to the first direction.

Figure 1:
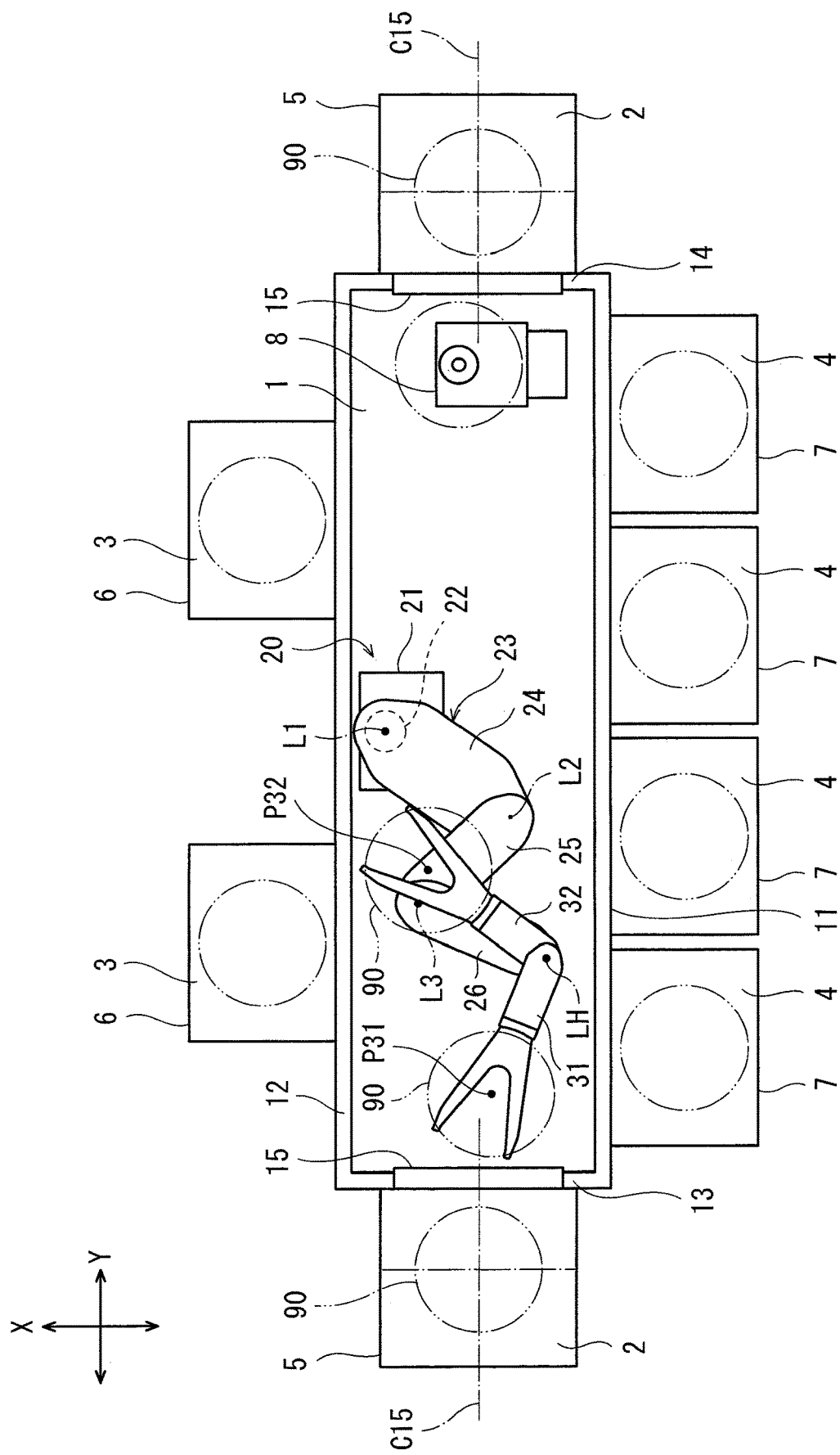
FIG. 1 is a plan view showing a substrate transport system according to an embodiment.

FIG. 1 is a plan view showing a substrate transport robot 20 according to the embodiment. As shown in FIG. 1, a substrate transport system 100 includes: a transport chamber 1; storage chamber forming parts 5 to 7 forming a plurality of storage chambers 2 to 4, respectively, which communicate with the transport chamber 1; and the substrate transport robot 20, which is installed inside the transport chamber 1.

The substrate transport robot 20 transports substrates 90 inside the transport chamber 1. The substrates 90 are, for example, disc-shaped semiconductor wafers, and the transport chamber 1 and the storage chambers 2 to 4 are clean chambers. The storage chambers 2 to 4 are formed by the storage chamber forming parts 5 to 7, respectively, and the substrates 90 are stored therein. Each "storage chamber" may be a space for storing and keeping the substrates 90, or may be a space for storing and processing the substrates 90, or may be a space for storing and preparing the substrates 90 for processing. In a case where the storage chamber is intended for keeping the substrates 90 therein, one example of the storage chamber forming part forming the storage chamber is a FOUP (Front Opening Unified Pod). In a case where the storage chamber is intended for processing the substrates 90 therein, the storage chamber forming part forming the storage chamber is a processing apparatus that performs any of various front-end-of-line processes, such as a cleaning process, a deposition process, a lithography process, an impurity injection process, a heat treatment process, or a flattening process. Reference sign 8 indicates an aligner installed inside the transport chamber 1 and configured to perform positioning of each substrate 90.

As one example, the transport chamber 1 is formed in a rectangular shape when seen in a plan view. The substrate transport system 100 includes a front wall 11, a rear wall 12, a first side wall 13, and a second side wall 14 as walls that demarcate the transport chamber 1. The front wall 11 and the rear wall 12 are spaced apart from each other in the forward-rearward direction X, and each of the front wall 11 and the rear wall 12 extends in the right-left direction Y. The first side wall 13 and the second side wall 14 are spaced apart from each other in the right-left direction Y, and each of the first side wall 13 and the second side wall 14 extends in the forward-rearward direction X. The first side wall 13 couples one end of the front wall 11 and one end of the rear wall 12 together, and the second side wall 14 couples the other end of the front wall 11 and the other end of the rear wall 12 together.

The storage chamber forming parts 5 to 7 are mounted on the outer surfaces of the walls 11 to 14, which demarcate the transport chamber 1. The storage chambers 2 to 4 communicate with the transport chamber 1 via openings formed in the walls 11 to 14. In the present embodiment, four storage chamber forming parts are provided on the front wall 11, two storage chamber forming parts are provided on the rear wall 12, one storage chamber forming part is provided on the first side wall 13, and one storage chamber forming part is provided on the second side wall 14. Each of the walls 11 to 14 is provided with at least one opening formed therein, such that the number of openings formed in each wall corresponds to the number of storage chamber forming parts provided on the wall. The storage chamber forming parts 7 provided on the front wall 11 may be FOUPs. The number of FOUPs is not limited to four, but may be two, three, or five or more. The number of storage chamber forming parts 6 provided on the rear wall 12 may be at least one, and is suitably changeable.

The storage chamber forming part 5 provided on the first side wall 13 and the storage chamber forming part 5 provided on the second side wall 14 are of the same type and same shape. Each of the storage chambers 2 formed by the storage chamber forming parts 5 communicates with the transport chamber 1 via an opening 15, which is formed in a corresponding one of the side walls 13 and 14. When seen in a plan view, a center line C15 of the opening 15 of the first side wall 13 is coaxial with a center line C15 of the opening 15 of the second side wall 14, and these center lines C15 extend in the right-left direction Y. The horizontal direction perpendicular to the center lines C15 is the forward-rearward direction X as the "first direction". In the present embodiment, the center lines C15 of the openings 15 pass through the center position between the front wall 11 and the rear wall 12 in the forward-rearward direction X, and each center line C15 also serves as the center line of the transport chamber 1.

Although not illustrated in detail, each storage chamber forming part 5 is capable of storing a plurality of substrates 90 in the storage chamber 2, such that the plurality of substrates 90 are arranged in the up-down direction. Accordingly, the storage chamber forming part 5 includes a plurality of placing portions that are arranged in the up-down direction. For example, each of the placing portions is constituted by a plurality of protrusions on the inside of the storage chamber 2. The protrusions of each placing portion are disposed at the same position in the up-down direction, and are spaced apart from each other in the circumferential direction. The peripheral edge of each substrate 90 is placed on the plurality of protrusions constituting one of the placing portions, and in this manner, each substrate 90 is supported by one placing portion. Each of the other storage chambers 3 and 4 is also provided with one or more placing portions. The configuration of the placing portions is not particularly limited.

The substrate transport robot 20 includes a base 21, a lifting/lowering shaft 22, an arm 23, a first hand 31, and a second hand 32. The base 21 is installed inside the transport chamber 1. The lifting/lowering shaft 22 extends upward from the base 21. The arm 23 includes a plurality of links 24 to 26, and is coupled to the base 21 via the lifting/lowering shaft 22. In the present embodiment, as one example, the number of links 24 to 26 is three. The proximal end portion of the proximal end link 24 is coupled to the lifting/lowering shaft 22, such that the proximal end portion of the proximal end link 24 is rotatable about a first arm axis L1. The proximal end portion of the middle link 25 is coupled to the distal end portion of the proximal end link 24, such that the proximal end portion of the middle link 25 is rotatable about a second arm axis L2. The proximal end portion of the distal end link 26 is coupled to the distal end portion of the middle link 25, such that the proximal end portion of the distal end link 26 is rotatable about a third arm axis L3. The proximal end portion and the distal end portion of the overall arm 23 are constituted by the proximal end portion of the proximal end link 24 and the distal end portion of the distal end link 26, respectively. The two hands 31 and 32 are coupled to the distal end portion of the arm 23, such that the two hands 31 and 32 are rotatable about a hand axis LH.

The substrate transport robot 20 or the arm 23 thereof is a horizontal articulated robot or a horizontal articulated arm. The arm axes L1 to L3 and the hand axis LH extend vertically, and each of the links 24 to 26 and the hands 31 and 32 rotates within a horizontal plane. The rotational axes of the two hands 31 and 32 are coaxial with each other, and the two hands 31 and 32 are rotatable independently of each other. The two hands 31 and 32 are positioned one on top of the other on the distal end link 26. Accordingly, the two hands 31 and 32 do not interfere with each other regardless of their rotation angles.

The front wall 11 and the rear wall 12 are longer in dimension than the first and second side walls 13 and 14. The transport chamber 1 is relatively long in the right-left direction Y, and relatively short in the forward-rearward direction X. The front wall 11 and the rear wall 12 are a pair of long-side walls extending in the longitudinal direction of the transport chamber 1, and the side walls 13 and 14 are a pair of short-side walls extending in the short direction of the transport chamber 1. The distance between the front wall 11 and the rear wall 12 is not greater than 800 mm, not greater than 700 mm, not greater than 600 mm, or not greater than 550 mm. In a case where a storage chamber forming part 7 provided on the front wall 11 is a FOUP, the front wall 11 is provided with a FOUP opener for opening/closing the FOUP. In this case, the minimum value of the distance between the rear wall 12 and the FOUP opener may be not greater than 800 mm, not greater than 700 mm, not greater than 600 mm, or not greater than 550 mm. It should be noted that the distance between the rear wall 12 and the FOUP opener may change while the FOUP opener is operating.

In the transport chamber 1, the base 21 is disposed at the center position in the right-left direction Y. In the transport chamber 1, the base 21 is shifted from the center line C15 of each opening 15 (and of the transport chamber 1) in the forward-rearward direction X toward one side. In the present embodiment, as one example, the base 21 is shifted rearward from the center line C15, such that the base 21 is adjacent to the rear wall 12. In other words, the lifting/lowering shaft 22, the first arm axis L1, and the proximal end portion of the arm 23 are shifted from the center line C15 in the forward-rearward direction X toward the one side. When seen in a plan view, the base 21 is disposed closer to one of the front wall 11 and the rear wall 12 than to the other (in this example, disposed closer to the rear wall 12), such that the distance between the first arm axis L1 and a part of the proximal end link 24 is greater than the distance between the first arm axis L1 and the closest point of the rear wall 12 to the first arm axis L1. The length (longitudinal dimension) of each of the links 24 to 26 constituting the arm 23, and the length (longitudinal dimension) of each of the hands 31 and 32 in the state of holding a substrate 90, are shorter than the distance between the front wall 11 and the rear wall 12, and yet sufficiently long so that each of the hands 31 and 32 can enter any of the storage chambers 2 to 4. By adopting such a configuration, even though the transport chamber 1 is short in dimension in the forward-rearward direction X, the links 24 to 26 can be made as long as possible within such a range that the links 24 to 26 will not interfere with the front wall 11 or the rear wall 12, and thus the movable range of each of the hands 31 and 32 is expanded in the right-left direction Y.

Figure 2:
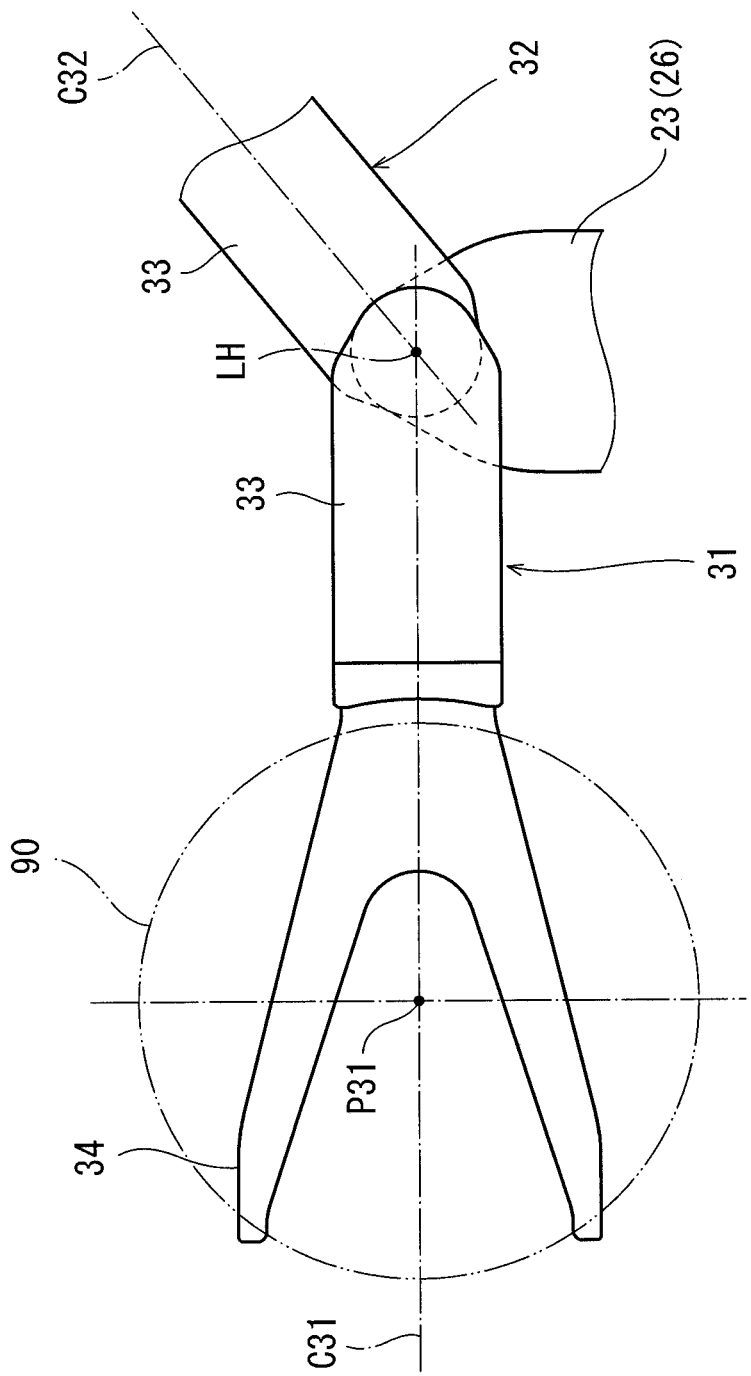
FIG. 2 is a plan view showing first and second hands according to the embodiment.

FIG. 2 is a plan view showing the first and second hands 31 and 32. The first hand 31 includes a base 33 and a substrate holder 34. The base 33 is formed by a hollow casing. The proximal end portion of the base 33 is coupled to the arm 23 around the hand axis LH. The substrate holder 34 is attached to the distal end portion of the base 33. The substrate holder 34 is a thin plate whose distal end side is branched into two portions, i.e., formed in a Y shape. The substrate holder 34 is formed in an axisymmetrical manner. The axis of symmetry of the substrate holder 34 forms a center line C31 of the first hand 31, and passes through the hand axis LH. A substrate 90 is held by the first hand 31 in the state of being placed on the substrate holder 34.

When the substrate 90 is held by the first hand 31, ideally, the center of the substrate 90 is positioned on the center line C31 of the first hand 31. Hereinafter, the position on the center line C31, at which the center of the substrate 90 is assumed to be positioned when it is held by the first hand 31, is referred to as a "reference position P31" of the first hand 31. The second hand 32 is configured in the same manner as the first hand 31. Reference sign C32 indicates the center line of the second hand 32. Reference sign P32 (see FIG. 1) indicates a reference position of the second hand 32.

Figure 3:
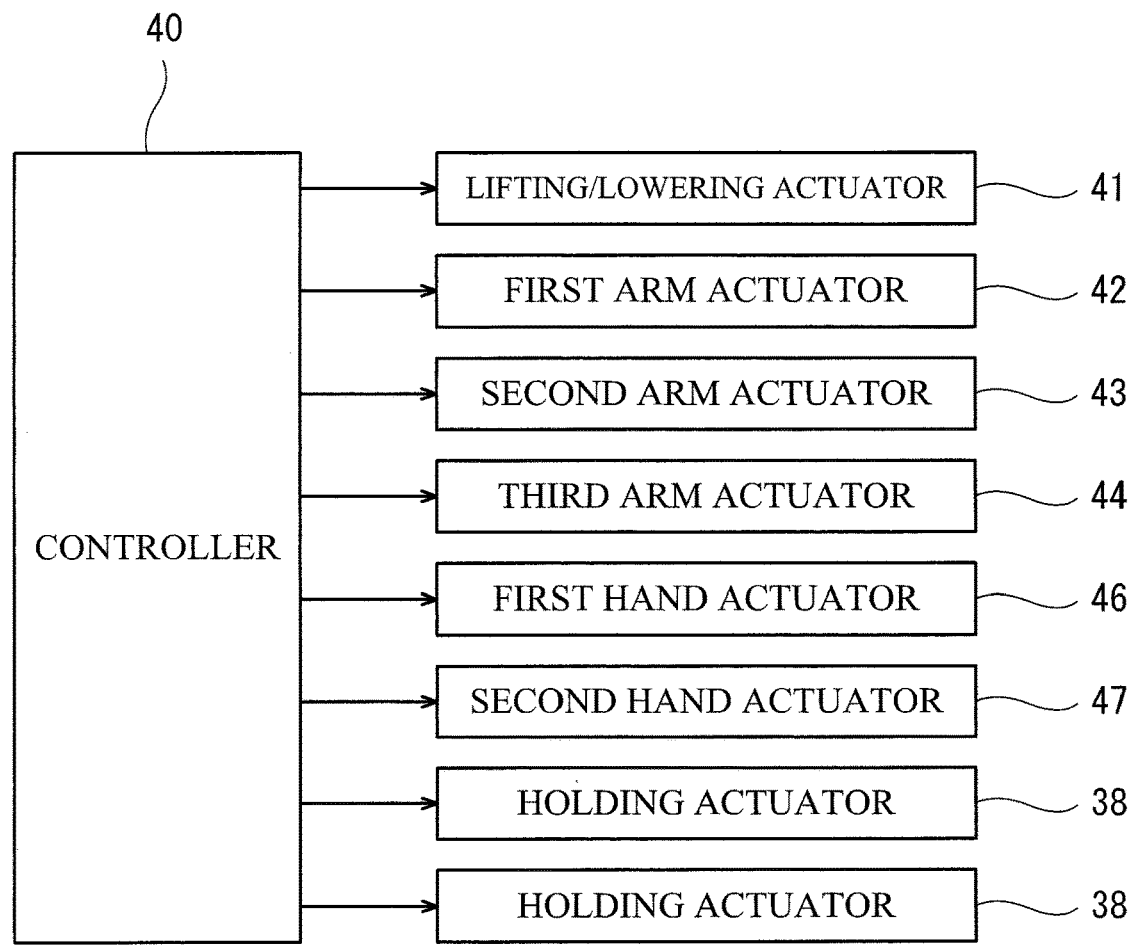
FIG. 3 is a block diagram showing a substrate transport robot according to the embodiment.

FIG. 3 is a block diagram showing the substrate transport robot 20. As shown in FIG. 3, the substrate transport robot 20 includes a controller 40. The controller 40 includes: a memory storing a program relating to performing the work of transporting substrates 90; a CPU configured to execute the program stored in the memory; and an interface connected to various actuators that are controlled as a result of the execution of the program.

The various actuators include two holding actuators 38, which are provided on the hands 31 and 32, respectively. Each of the holding actuators 38 holds or releases a substrate 90 placed on a corresponding one of the hands 31 and 32. The various actuators also include a lifting/lowering actuator 41, first to third arm actuators 42 to 44, and first and second hand actuators 46 and 47. The lifting/lowering actuator 41 operates the lifting/lowering shaft 22 to lift and lower the arm 23 and the hands 31 and 32 relative to the base 21. The first arm actuator 42 rotates the proximal end link 24 about the first arm axis L1 relative to the lifting/lowering shaft 22 and the base 21. The second arm actuator 43 rotates the middle link 25 about the second arm axis L2 relative to the proximal end link 24. The third arm actuator 44 rotates the distal end link 26 about the third arm axis L3 relative to the middle link 25. The first hand actuator 46 rotates the first hand 31 about the hand axis LH relative to the arm 23. The second hand actuator 47 rotates the second hand 32 about the hand axis LH relative to the arm 23. By means of these actuators 41 to 44, 46, and 47, the position and posture of each of the arm 23 and the hands 31 and 32 are changed, and thereby the hands 31 and 32 are moved. As one example, the actuators 41 to 44, 46, and 47 are electric motors. The lifting/lowering actuator 41 may be a cylinder.

Figure 4:
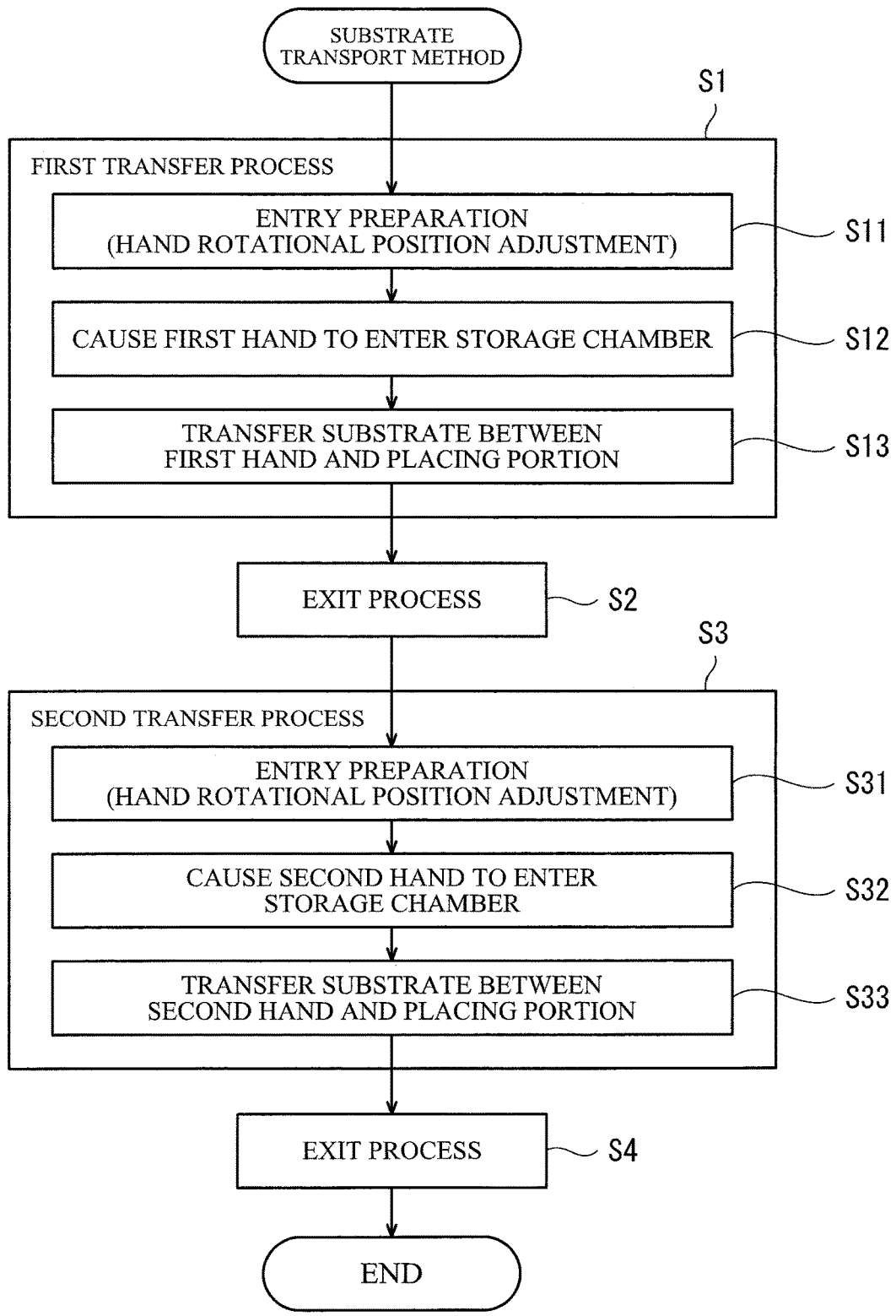
FIG. 4 is a flowchart showing one example of a substrate transport method according to the embodiment.

FIG. 4 is a flowchart showing one example of a substrate transport method performed by the controller 40. As one example of the substrate transport method, the description hereinafter describes a series of transport processes made up of the following steps (1) to (6): (1) causing the first hand 31 to enter from the transport chamber 1 into the storage chamber 2 of the storage chamber forming part 5 provided on the first side wall 13; (2) transferring a substrate 90 between the first hand 31 and a placing portion in the storage chamber 2; (3) causing the first hand 31 to exit the storage chamber 2 into the transport chamber 1; (4) causing the second hand 32 to enter from the transport chamber 1 into the same storage chamber 2; (5) transferring a substrate 90 between the second hand 32 and a placing portion in the storage chamber 2; and (6) causing the second hand 32 to exit the storage chamber 2 into the transport chamber 1. In the present embodiment, the step (4) is performed immediately after the step (3), and between the steps (3) and (4), a step of causing the first hand 31 or the second hand 32 to enter/exit another storage chamber, which is different from the storage chamber 2 provided on the first side wall 13, is not performed.

In the step (2), the transferring of the substrate 90 between the first hand 31 and the placing portion means performing either one of the following operation (a) or operation (b). The operation (a) is the operation of releasing a substrate 90 held by the first hand 31 in the storage chamber 2 to place the released substrate 90 onto one of the placing portions, thereby rendering the first hand 31 empty, and the operation (b) is the operation of placing a substrate 90 present on one of the placing portions onto the first hand 31 to render the one placing portion empty, thereby holding the substrate 90 by the first hand 31. In the step (5), the transferring of the substrate 90 between the second hand 32 and the placing portion is performed in the same manner as the step (2).

As shown in FIG. 4, the controller 40 is configured to perform, as one example of the substrate transport method, a first transfer process S1, an exit process S2, a second transfer process S3, and an exit process S4 sequentially. The first transfer process S1 corresponds to the above steps (1) and (2). The exit process S2 corresponds to the above step (3). The second transfer process S3 corresponds to the above steps (4) and (5). The exit process S4 corresponds to the above step (6).

The first transfer process S1 includes an entry preparation process S11, an entry process S12, and a transfer process S13. These processes S11 to S13 are performed sequentially. In the entry preparation process S11, the rotational positions of the hands 31 and 32 are adjusted so that the first hand 31 can readily enter the storage chamber 2, and so that the second hand 32 will not interfere with the walls 11 to 14, which demarcate the transport chamber 1. The operations of the hand actuators 46 and 47 are controlled for the adjustment. In addition, the operation of the lifting/lowering actuator 41 may be controlled for adjusting the height of the first hand 31. In the entry process S12, the first hand 31 is caused to enter from the transport chamber 1 into the storage chamber 2 through the opening 15. For moving the first hand 31, the operations of at least the arm actuators 42 to 44 are controlled. In addition, the operation of the first hand actuator 46 may be controlled. In the transfer process S13, a substrate 90 is transferred between the first hand 31 and one of the placing portions. For the transferring, the operations of the holding actuator 38 of the first hand 31 and the lifting/lowering actuator 41 are controlled.

Figure 5:
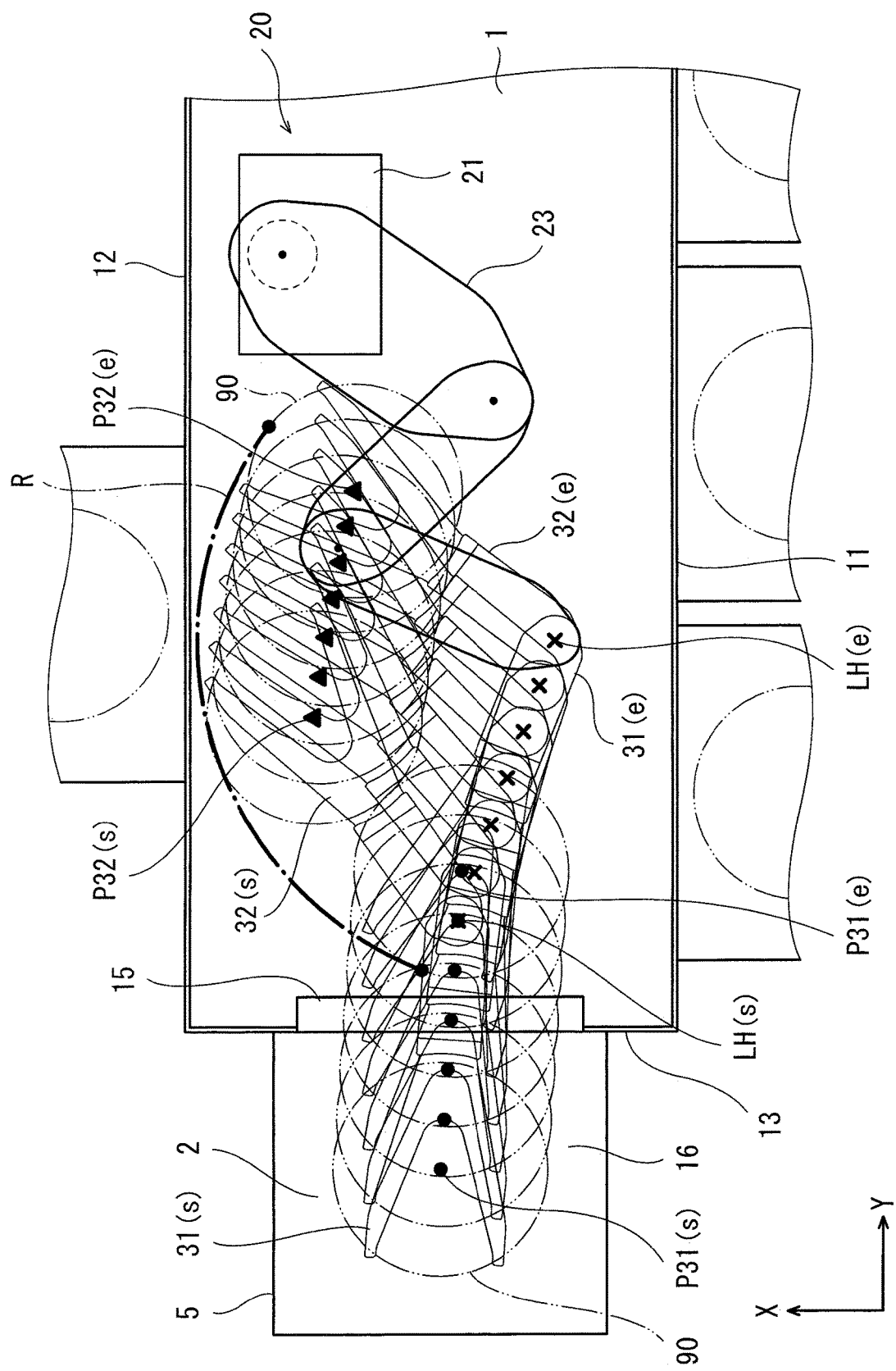
FIG. 5 is a plan view showing an exit process according to the embodiment.
Figure 6:
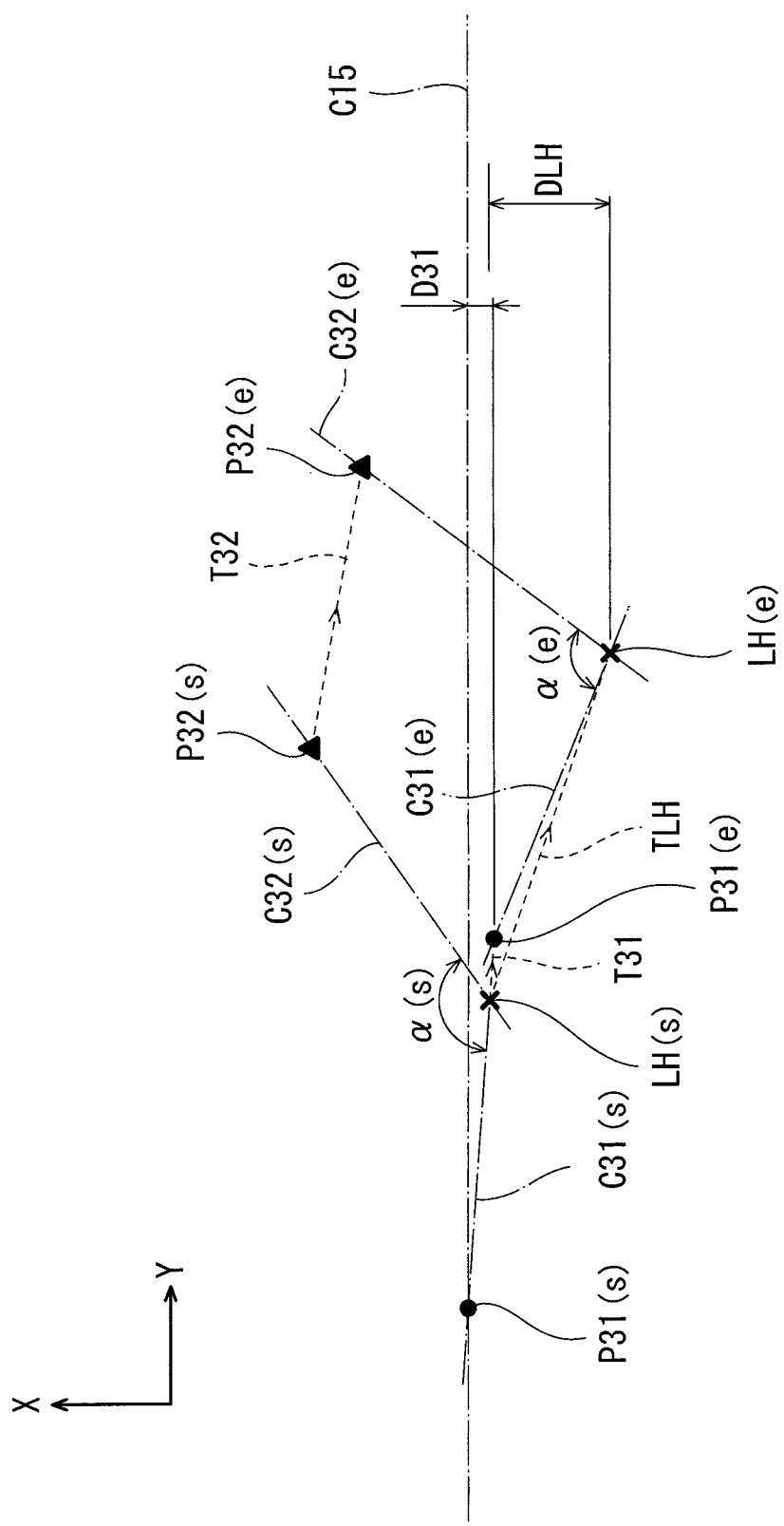
FIG. 6 is a conceptual diagram showing the exit process according to the embodiment.

FIG. 5 shows the first hand 31 and the second hand 32 as seen in a plan view at seven time points from the start time point to the end time point of the exit process S2. Plotted dot symbols each represent the reference position P31 of the first hand 31. Plotted triangular symbols each represent the reference position P32 of the second hand 32. Plotted cross symbols each represent the hand axis LH. FIG. 6 shows the reference positions P31 and P32 and the hand axis LH at two time points that are the start time point and the end time point of the exit process S2. For the hands 31 and 32, the center lines C31 and C32, the reference positions P31 and P32, an angle α formed by the first hand 31 and the second hand 32, and the hand axis LH, subscripts (s) and (e) added to their reference signs represent the start time point and the end time point of the exit process S2, respectively. It should be noted that the angle α formed by the hands 31 and 32 is typically an angle formed by the center lines C31 and C32. Reference sign T31 indicates a path of the reference position P31 in the exit process S2. Reference sign T32 indicates a path of the reference position P32 in the exit process S2. Reference sign TLH indicates a path of the hand axis LH in the exit process S2. In the present embodiment, all of the three paths T31, T32, and TLH are shown as straight lines. However, this is merely one example. At least one of the paths may be entirely or partly a curve. Reference sign D31 indicates a moving amount of the reference position P31 in the first direction X in the exit process S2. Reference sign DLH indicates a moving amount of the hand axis LH in the first direction X in the exit process S2. It should be noted that, in the present embodiment, during the exit process S2 being performed, the controller 40 is configured not to drive the lifting/lowering shaft 22, and the arm 23 and the hands 31 and 32 do not move in the up-down direction.

At the start time point in the exit process S2, the substrate holder 34 of the first hand 31(s) is positioned inside the storage chamber 2. The base 33 of the first hand 31(s), the hand axis LH(s), and the entire second hand 32(s) are positioned inside the transport chamber 1. The angle α(s) has a large value so that the second hand 32 will not interfere with the rear wall 12 or the first side wall 13 as a result of performing the entry preparation process S11 of the first transfer process S1. The reference position P31(s) is positioned on the center line C15 of the opening 15. The hand axis LH(s) is slightly spaced apart from the center line C15 of the opening 15 in the forward-rearward direction X toward one side (specifically, forward). The center line C31(s) extends in the right-left direction Y, but slightly inclined in the forward-rearward direction X, and the angle formed by the center lines C15 and C31(s) is small, which makes it possible to prevent the first hand 31 from interfering with the storage chamber 2 and the edge of the opening 15.

During the exit process S2 being performed, the controller 40 controls the operations of the arm 23 and the first hand 31 in a manner to move the hand axis LH away from the center line C15 of the opening 15 in the forward-rearward direction X, such that the hand axis LH is farther from the center line C15 than the first hand 31 (more specifically, the reference position P31 of the first hand 31) is. The position or the path TLH of the hand axis LH is controlled by the posture of the links 24 to 26. The position or the path T31 of the reference position P31 of the first hand 31 is controlled by the posture of the first hand 31 (i.e., by a rotation angle of the first hand 31 about the hand axis LH). At the start time point in the exit process S2, the hand axis LH(s) is already spaced apart from the center line C15 of the opening 15 by an amount greater than an amount by which the reference position P31(s) is spaced apart from the center line C15 (here, the amount by which the reference position P31(s) is spaced apart from the center line C15 is zero). The moving amount DLH is greater than the moving amount D31. As a result, at the end time point, the hand axis LH(e) is more spaced apart from the center line C15 in the forward-rearward direction X than the reference position P31(e) of the first hand 31 is. The distance from the hand axis LH(e) to the rear wall 12 is greater than the distance from the hand axis LH(e) to the distal end of the second hand 32. Accordingly, even if the second hand 32 rotates, the second hand 32 will not interfere with the rear wall 12 (see an arc R).

In the present embodiment, the base 21 is spaced apart from the center line C15 in the forward-rearward direction X toward one side (upward in FIGS. 1 and 5). The arm 23 includes the three links 24 to 26. In a state where the hand axis LH has been brought close to the center of the transport chamber 1 in the right-left direction Y by folding the three links 24 to 26, the hand axis LH is positioned away from the center line C15 in the forward-rearward direction X toward the other side (downward in FIGS. 1 and 5). During the exit process S2 being performed, the controller 40 is configured to control the operation of the arm 23, such that the hand axis LH moves in the forward-rearward direction X toward the other side while moving toward the far side from the opening 15 in the right-left direction Y (to the right in FIGS. 1 and 5). Accordingly, the hand axis LH moves away from the center line C15 of the opening 15 in the forward-rearward direction X in a manner to move farther from the rear wall 12 and closer to the front wall 11.

If the posture of the first hand 31 is not changed, the reference position P31 of the first hand 31 moves parallel to the hand axis LH. In the present embodiment, during the exit process S2 being performed, the controller 40 is configured to control the operation of the first hand 31, such that the moving amount of the reference position P31 in the forward-rearward direction X is less than the moving amount of the hand axis LH in the forward-rearward direction X. Specifically, while the hand axis LH is being moved in the above-described manner, the first hand 31 is rotated in such a rotation direction (clockwise in FIGS. 1 and 5) that the distal end of the first hand 31 is directed toward the aforementioned one side in the forward-rearward direction X (the opposite direction to the moving direction of the hand axis LH, i.e., upward in FIGS. 1 and 5).

The position or the path T32 of the reference position P32 of the second hand 32 is controlled by the posture of the second hand 32 (i.e., by a rotation angle of the second hand 32 about the hand axis LH). If the posture of the second hand 32 is not changed, the reference position P32 of the second hand 32 moves parallel to the hand axis LH. In the present embodiment, during the exit process S2 being performed, the controller 40 is configured to control the operation of the second hand 32, such that the angle α between the first hand 31 and the second hand 32 decreases. Specifically, while the hand axis LH and the reference position P31 of the first hand 31 are being moved in the above-described manner, the second hand 32 is rotated in such a rotation direction (counterclockwise in FIGS. 1 and 5) that the second hand 32 is brought closer to the first hand 31. It should be noted that even in a case where the second hand 32 is rotated in the same rotation direction as the first hand 31, if the rotation angle of the second hand 32 is less than that of the first hand 31, then the angle α(e) at the end time point is less than the angle α(s) at the start time point. In the present embodiment, the first hand 31 and the second hand 32 are rotated in respective directions facing each other. Accordingly, the difference between the angle α(s) at the start time point and the angle α(e) at the end time point is great, and the angle α(e) at the end time point is small.

Returning to FIG. 4, when the exit process S2 is completed, the second transfer process S3 is performed. Also in the second transfer process S3, similar to the first transfer process S1, an entry preparation process S31, an entry process S32, and a transfer process S33 are performed sequentially.

In the entry preparation process S31, the rotational positions and the heights of the first hand 31 and the second hand 32 are adjusted so that the second hand 32 can readily enter the storage chamber 2, and so that the first hand 31 will not interfere with the walls 11 to 14, which demarcate the transport chamber 1. The operations of the first hand actuator 46, the second hand actuator 47, and the lifting/lowering actuator 41 are controlled for the adjustment. In the entry preparation process S31, the second hand 32 is rotated until the posture of the second hand 32 relative to the hand axis LH becomes the same as the posture of the first hand 31 relative to the hand axis LH at the end time point in the exit process S2. Also, the first hand 31 is rotated until the posture of the first hand 31 relative to the hand axis LH becomes the same as the posture of the second hand 32 relative to the hand axis LH at the end time point in the exit process S2.

Figure 7:
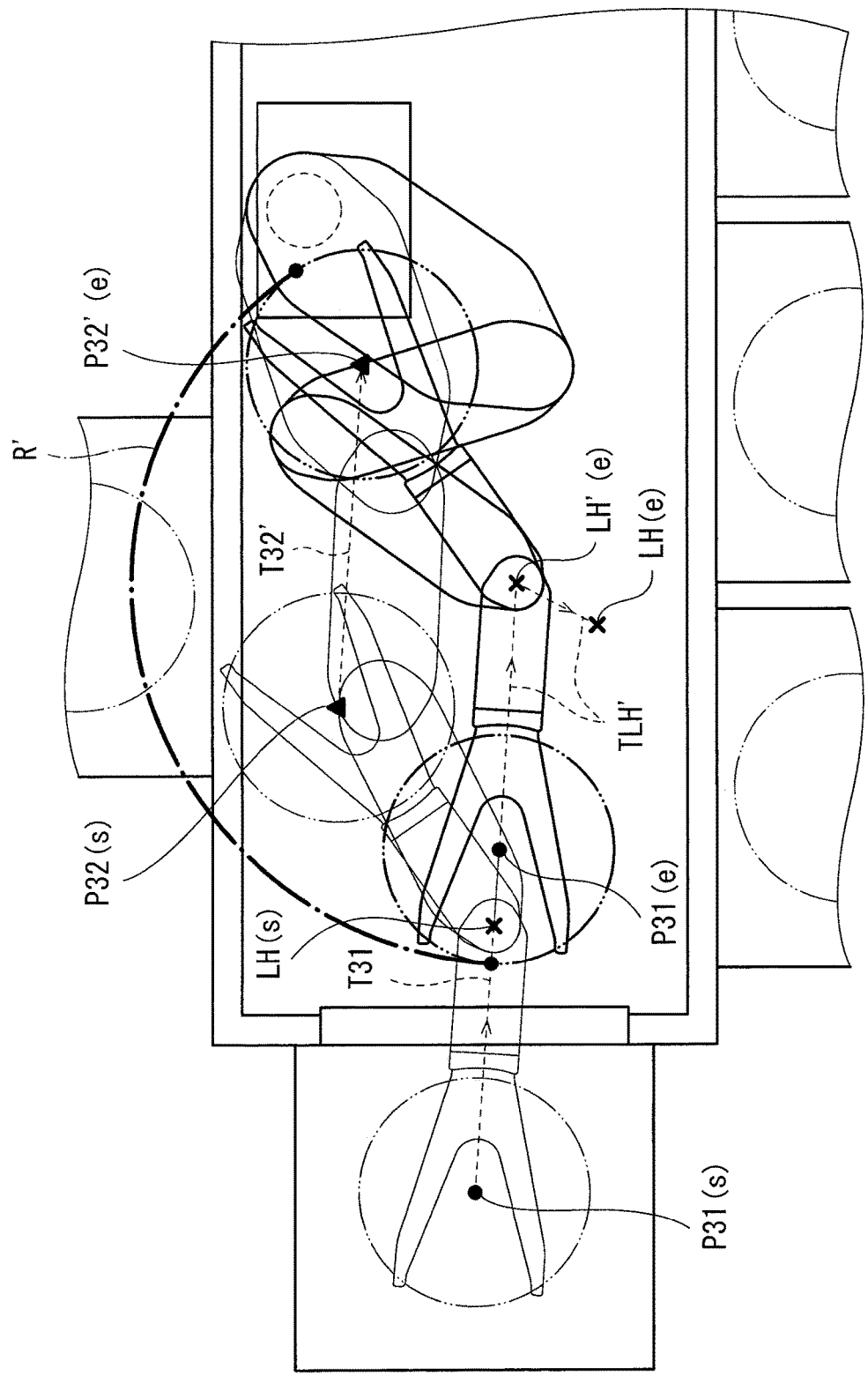
FIG. 7 is a plan view showing an exit process according to a comparative example.

FIG. 7 is a plan view showing an exit process according to a comparative example. With reference to the comparative example, the exit process S2 according to the present embodiment, and the entry preparation process S31 and the entry process S32 performed after the exit process S2, are described. In the comparative example, the transport chamber 1, the storage chamber 2, and the substrate transport robot 20 are the same as those in the present embodiment. The postures of the arm 23 and the hands 31 and 32 at the start time point in the exit process are the same as those in the present embodiment. The path T31 of the reference position P31 of the first hand 31 is the same as that in the present embodiment. On the other hand, during the exit process being performed, neither the first hand 31 nor the second hand 32 is rotated about the hand axis LH. Accordingly, paths TLH' and T32' of the hand axis LH and the reference position P32, respectively, are parallel to the path T31 of the reference position P31, and the hand axis LH and the two reference positions P31 and P32 move parallel to each other. In the exit process, the moving amount of the hand axis LH in the forward-rearward direction X is the same as the moving amount of the reference position P31 in the forward-rearward direction X. The angle between the first hand 31 and the second hand 32 does not change between before and after the exit process.

In this case, at a time point when the reference position P31 of the first hand 31 has moved to the same position as the reference position P31(e) at the end time point in the exit process S2 of the present embodiment, the hand axis LH'(e) and the reference position P32'(e) are not sufficiently far from the rear wall 12. Therefore, if the second hand 32 is rotated in this state, the second hand 32 interferes with the rear wall 12 as indicated by an arc R' shown in FIG. 7. It should be noted that the center of the arc R' is the hand axis LH'(e); the radius of the arc R' is the distance from the center of the arc R' to the point of intersection between the center line of the second hand 32 and the peripheral edge of the substrate 90; and the arc R' represents the path of the substrate 90 on the second hand 32. In order to avoid the interference, the hand axis LH needs to be moved again so as to become closer to the front wall 11. It should be noted that reference sign LH(e) shown in FIG. 7 indicates the position of the hand axis LH at the end time point in the exit process S2 according to the present embodiment shown in FIG. 5. If the hand axis LH is moved to this position, the second hand 32 can be rotated without causing the interference thereof with the rear wall 12. In the comparative example, after the first hand 31 is caused to exit the storage chamber 2, the step of moving the hand axis LH in the forward-rearward direction X needs to be additionally performed, which causes decrease in the throughput of the substrate transport robot 20.

On the other hand, in the present embodiment, while causing the first hand 31 to exit the storage chamber 2, the hand axis LH is moved away from the center line C15 of the opening 15 in a manner to move the hand axis LH closer to the front wall 11 and farther from the rear wall 12. Therefore, after the exit process S2 is completed, even when the second hand 32 is rotated so as to bring the second hand 32 closer to the opening 15, the second hand 32 can be prevented from interfering with the rear wall 12 as indicated by the arc R shown in FIG. 5. It should be noted that the center of the arc R is the hand axis LH(e); the radius of the arc R is the distance from the center of the arc R to the point of intersection between the center line of the second hand 32 and the peripheral edge of the substrate 90; and the arc R represents the path of the substrate 90 on the second hand 32. The hand axis LH(e) is away from the rear wall 12 by the same distance as the radius of the arc R, or by a distance slightly greater than the radius of the arc R. As compared to the comparative example, the moving distance and moving time of the hand axis LH required from when the exit process of the first hand 31 starts until when the second hand 32 starts rotating can be reduced, and thereby the throughput can be improved. While the hand axis LH is moving away from the center line C15, the reference position P31 of the first hand 31 moves along the center line C15. This makes it possible to prevent the first hand 31 and, if any, a substrate 90 held thereby from interfering with the inner surfaces of the storage chamber 2 or the edge of the opening 15.

During the exit process S2 being performed, the angle α between the first hand 31 and the second hand 32 decreases, which means that a necessary amount of rotation of the second hand 32 in the entry preparation process S31 decreases. In other words, practically, the entry preparation is already started during the exit process S2 being performed. This makes it possible to reduce a time required for performing the entry preparation process S31, which is performed after the exit process S2 is completed.

In the entry preparation process S31, the first hand 31 is rotated. Similar to the second hand 32, the first hand 31 can also be prevented from interfering with the rear wall 12. In the present embodiment, the first hand 31 is rotated such that the posture of the first hand 31 becomes the same as that of the second hand 32 at the end time point in the exit process. In the entry preparation process S31, the amount of rotation (the absolute value of the rotation angle) of the first hand 31 and the amount of rotation of the second hand 32 are equal to each other, and if the two hands 31 and 32 start rotating at the same time at the same rotation speed, the rotation of the hand 31 and the rotation of the hand 32 can be ended at the same time. In this case, in the entry preparation process S31, there is no dead time in which one hand waits for the other hand to rotate. In the entry preparation process S31, the lifting/lowering actuator 41 may be operated to adjust the height of the second hand 32.

During the entry process S32 being performed, the controller 40 controls the operations of the arm 23 and the hands 31 and 32, such that the hand axis LH and the reference positions P31 and P32 move along the same paths as those in the exit process S2 but in the opposite directions to the moving directions in the exit process S2. The reference position P32 of the second hand 32 moves along the path T31 of the reference position P31 of the first hand 31 in the exit process S2, but in the opposite direction to the moving direction of the reference position P31 in the exit process S2. The reference position P31 of the first hand 31 moves along the path T32 of the reference position P32 of the second hand 32 in the exit process S2, but in the opposite direction to the moving direction of the reference position P32 in the exit process S2. In this manner, also in the entry process S32, the moving distance and moving time of the hand axis LH can be reduced, and thereby the throughput can be improved. The angle α between the first hand 31 and the second hand 32 increases, and the first hand 31 can be prevented from interfering with the rear wall 12 when the second hand 32 enters the storage chamber 2. In the entry preparation process S31, the first hand 31 is rotated, but is not rotated to the position that is required at the end time point in the entry process S32, i.e., the rotation is stopped before reaching the position. Then, during the entry process S32 being performed, the rotation of the first hand 31 is resumed so as to reach such a position that the interference can be prevented. In other words, during the entry process S32 being performed, the entry preparation previously not completed in the entry preparation process S31 is resumed. This makes it possible to eliminate the aforementioned dead time and reduce the time required for performing the entry preparation process S31.

The exit process S4 intended for the second hand 32 may be the same as or different from the exit process S2 intended for the first hand 31. The entry process S12 intended for the first hand 31 may be the same as or different from the entry process S32 intended for the second hand 32.

Although the embodiment has been described as above, the above-described configurations are non-limiting examples, and modifications, additions, and/or deletions can be made thereto within the scope of the present invention. The number of links constituting the arm 23 is not limited to three, but may be two or four or more. The above-described embodiment gives examples in which the hands 31 and 32 enter/exit the storage chamber 2, which is continuous with the transport chamber 1, through the first side wall 13. However, the above-described embodiment is also applicable to a case in which the hands 31 and 32 enter/exit the other storage chamber 2, which is continuous with the transport chamber 1, through the other wall, in particular, the second side wall 14. The reference positions P31 and P32 are not limited to the above examples. The reference position P31 of the first hand 31 can be set to any position that is closer to the distal end of the first hand 31 than the hand axis LH is. The same is true of the reference position P32 of the second hand 32. The base 21 is shifted in the forward-rearward direction X toward one side (rearward), and in the exit process S2, the hand axis LH is moved in the forward-rearward direction X toward the other side (forward), i.e., the opposite side to the base 21. However, as an alternative, in the exit process S2, the hand axis LH may be moved toward the same side as the base 21.

What is claimed is:
1. A substrate transport robot comprising:
a base installed inside a transport chamber;
an arm coupled to the base and including at least three links, each of the at least three links being configured to rotate within a horizontal plane;
a first hand and a second hand, each of the first hand and the second hand being coupled to a distal end portion of the arm such that each of the first hand and the second hand is rotatable about a vertical hand axis, the first hand and the second hand each being configured to support a substrate;

at least five actuators that drive the at least three links, the first hand, and the second hand to rotate, respectively; and a controller configured to control operations of the at least five actuators, the controller being configured to perform:
  a first transfer process of causing the first hand to enter from the transport chamber into a storage chamber that communicates with the transport chamber via an opening, and transferring the substrate between the first hand and a placing portion in the storage chamber, the placing portion being a portion on which the substrate is to be placed;
  an exit process of causing the first hand to exit the storage chamber and move into the transport chamber, and controlling operations of the arm and the first hand to move the hand axis away from a center line of the opening, the center line being perpendicular to the opening, such that the hand axis is farther from the center line than a reference position of the first hand; and
  a second transfer process of causing the second hand to enter from the transport chamber into the storage chamber, and transferring the substrate between the placing portion and the second hand.

2. The substrate transport robot according to claim 1, wherein:
  the transport chamber is constituted by a front wall, a rear wall, and side walls, the front wall and the rear wall each extending in a direction in which the center line extends, the side walls coupling the front and rear walls together,
  the transport chamber includes, as the opening, at least one opening formed in at least one of the side walls, and
  in the exit process, the controller is configured to control the operations of the arm and the first hand to bring the hand axis closer to one of the front wall and the rear wall while moving the hand axis in the direction in which the center line extends.

3. The substrate transport robot according to claim 2, wherein each of the front wall and the rear wall is longer in dimension than the side walls.

4. The substrate transport robot according to claim 1, wherein in the exit process, the controller is configured to control an operation of the second hand, such that an angle between the first hand and the second hand decreases.

5. The substrate transport robot according to claim 1, wherein:
  among the at least three links, a first link is connected to the base and includes a first rotational axis, the first rotational axis being a proximal-end rotational axis of the first link and being disposed at a position away from the center line, and the other links of the at least three links different from the first link each include a proximal-end rotational axis, and
  in the exit process, the controller is configured to control the operations of the at least five actuators such that, among the at least three links, the proximal-end rotational axes of the other respective links different from the first link, the hand axis, the reference position of the first hand, and a reference position of the second hand are positioned in a first direction relative to the first rotational axis, the first direction extending from the first rotational axis toward the center line.

6. A substrate transport system comprising:
  a transport chamber in which a substrate is transported;
  a storage chamber forming part forming a storage chamber that communicates with the transport chamber via an opening, the storage chamber including a placing portion on which the substrate is to be placed; and
  a substrate transport robot including:
    a base installed inside the transport chamber;
    an arm coupled to the base and including at least three links, each of the at least three links being configured to rotate within a horizontal plane;
    a first hand and a second hand, each of the first hand and the second hand being coupled to a distal end portion of the arm such that each of the first hand and the second hand is rotatable about a vertical hand axis, the first hand and the second hand each being configured to support the substrate;
    at least five actuators that drive the at least three links, the first hand, and the second hand to rotate, respectively; and
    a controller configured to control operations of the at least five actuators, the controller being configured to perform:
      a first transfer process of causing the first hand to enter from the transport chamber into the storage chamber, and transferring the substrate between the placing portion and the first hand;
      an exit process of causing the first hand to exit the storage chamber and move into the transport chamber, and controlling operations of the arm and the first hand to move the hand axis away from a center line of the opening, the center line being perpendicular to the opening, such that the hand axis is farther from the center line than a reference position of the first hand; and
      a second transfer process of causing the second hand to enter from the transport chamber into the storage chamber, and transferring the substrate between the placing portion and the second hand.

7. The substrate transport system according to claim 6, wherein:
  among the at least three links, a first link is connected to the base and includes a first rotational axis, the first rotational axis being a proximal-end rotational axis of the first link and being disposed at a position away from the center line, and the other links different from the first link each include a proximal-end rotational axis, and
  in the exit process, the controller is configured to control the operations of the at least five actuators such that, among the at least three links, the proximal-end rotational axes of the other respective links different from the first link, the hand axis, the reference position of the first hand, and a reference position of the second hand are positioned in a first direction relative to the first rotational axis, the first direction extending from the first rotational axis toward the center line.

8. A substrate transport method of transporting a substrate by a substrate transport robot, the substrate transport robot including: (i) a base installed inside a transport chamber; (ii) an arm coupled to the base and including at least three links, each of the at least three links being configured to rotate within a horizontal plane; (iii) a first hand and a second hand, each of the first hand and the second hand being coupled to a distal end portion of the arm such that each of the first hand and the second hand is rotatable about a vertical hand axis, the first hand and the second hand each being configured to support a substrate; and (iv) at least five actuators that drive the at least three links, the first hand, and the second hand to rotate, respectively, the method comprising:

a first transfer step of causing the first hand to enter from the transport chamber into a storage chamber that communicates with the transport chamber via an opening, and transferring the substrate between the first hand and a placing portion in the storage chamber, the placing portion being a portion on which the substrate is to be placed;

an exit step of causing the first hand to exit the storage chamber and move into the transport chamber to move the hand axis away from a center line of the opening, the center line being perpendicular to the opening, such that the hand axis is farther from the center line than a reference position of the first hand; and a second transfer step of causing the second hand to enter from the transport chamber into the storage chamber, and transferring the substrate between the placing portion and the second hand.

9. The substrate transport method according to claim 8, wherein:

among the at least three links, a first link is connected to the base and includes a first rotational axis, the first rotational axis being a proximal-end rotational axis of the first link and being disposed at a position away from the center line, and the other links different from the first link each include a proximal-end rotational axis, and the exit step includes causing the first hand to exit the storage chamber into the transport chamber such that, among the at least three links, the proximal-end rotational axes of the other respective links different from the first link, the hand axis, the reference position of the first hand, and a reference position of the second hand are positioned in a first direction relative to the first rotational axis, the first direction extending from the first rotational axis toward the center line.

* * * * *